(12) United States Patent
Ivey et al.

(10) Patent No.: US 8,482,212 B1
(45) Date of Patent: Jul. 9, 2013

(54) LIGHT SOURCES INCORPORATING LIGHT EMITTING DIODES

(75) Inventors: John Ivey, Farmington Hills, MI (US); Jos Timmermans, Ortonville, MI (US); Jean C. Raymond, Nominique (CA)

(73) Assignee: iLumisys, Inc., Troy, MI (US)

( * ) Notice: Subject to any disclaimer, the term of this patent is extended or adjusted under 35 U.S.C. 154(b) by 627 days.

(21) Appl. No.: 12/242,033

(22) Filed: Sep. 30, 2008

Related U.S. Application Data

(63) Continuation of application No. 11/007,417, filed on Dec. 8, 2004, now Pat. No. 8,093,823, which is a continuation-in-part of application No. 09/782,375, filed on Feb. 12, 2001, now Pat. No. 7,049,761.

(60) Provisional application No. 60/181,744, filed on Feb. 11, 2000.

(51) Int. Cl.
*H05B 37/00* (2006.01)

(52) U.S. Cl.
USPC ......... 315/224; 315/185 R; 315/246; 315/291

(58) Field of Classification Search
USPC .............. 315/291, 246, 247, 224, 185 R, 192
See application file for complete search history.

(56) References Cited

U.S. PATENT DOCUMENTS

| | | |
|---|---|---|
| 3,612,855 A | 10/1971 | Juhnke |
| 3,993,386 A | 11/1976 | Rowe |
| 4,102,558 A | 7/1978 | Krachman |
| 4,107,581 A | 8/1978 | Abernethy |
| 4,189,663 A | 2/1980 | Schmutzer et al. |
| 4,211,955 A | 7/1980 | Ray |
| 4,581,687 A | 4/1986 | Nakanishi |
| 4,597,033 A | 6/1986 | Meggs et al. |
| 4,607,317 A | 8/1986 | Lin |
| 4,661,890 A | 4/1987 | Watanabe et al. |
| 4,698,730 A | 10/1987 | Sakai et al. |
| 4,748,545 A | 5/1988 | Schmitt |
| 4,758,173 A | 7/1988 | Northrop |
| 4,810,937 A | 3/1989 | Havel |

(Continued)

FOREIGN PATENT DOCUMENTS

| | | |
|---|---|---|
| DE | 196 51 140 A1 | 6/1997 |
| DE | 196 24 087 A1 | 12/1997 |

(Continued)

OTHER PUBLICATIONS

Office Action dated May 15, 2008 in U.S. Appl. No. 11/007,417.

(Continued)

*Primary Examiner* — David H Vu
(74) *Attorney, Agent, or Firm* — Young Basile

(57) ABSTRACT

A light source including at least one light emitting diode and, optionally, a housing portion surrounding the light emitting diode. The at least one light emitting diode can be an organic light-emitting diode sheet. The at least one light emitting diode is preferably enclosed in a housing portion comprising a hollow bulb-shaped portion formed of glass, plastic, etc. The housing portion can be filled partially or completely by a potting material. Alternatively, the housing portion can be formed of a potting material or a conformal coating material. At least one connector is coupled to the end of the housing portion. A power supply circuit supplies electrical current to the at least one light emitting diode through the connector.

17 Claims, 7 Drawing Sheets

U.S. PATENT DOCUMENTS

| | | |
|---|---|---|
| 4,912,371 A | 3/1990 | Hamilton |
| 4,941,072 A | 7/1990 | Yasumoto et al. |
| 4,943,900 A | 7/1990 | Gartner |
| 5,018,054 A | 5/1991 | Ohashi et al. |
| 5,027,037 A | 6/1991 | Wei |
| 5,036,248 A | 7/1991 | McEwan et al. |
| 5,103,382 A | 4/1992 | Kondo et al. |
| 5,136,483 A | 8/1992 | Schoniger et al. |
| 5,140,220 A | 8/1992 | Hasegawa |
| 5,151,679 A | 9/1992 | Dimmick |
| 5,303,124 A | 4/1994 | Wrobel |
| 5,321,593 A | 6/1994 | Moates |
| 5,365,411 A | 11/1994 | Rycroft et al. |
| D354,360 S | 1/1995 | Murata |
| 5,388,357 A | 2/1995 | Malita |
| 5,404,094 A | 4/1995 | Green et al. |
| 5,463,280 A | 10/1995 | Johnson |
| 5,463,502 A | 10/1995 | Savage, Jr. |
| 5,561,346 A | 10/1996 | Byrne |
| 5,575,459 A | 11/1996 | Anderson |
| 5,581,158 A | 12/1996 | Quazi |
| 5,607,227 A | 3/1997 | Yasumoto et al. |
| 5,608,290 A | 3/1997 | Hutchisson et al. |
| 5,622,423 A | 4/1997 | Lee |
| 5,655,830 A | 8/1997 | Ruskouski |
| 5,661,645 A | 8/1997 | Hochstein |
| 5,682,103 A | 10/1997 | Burrell |
| 5,684,523 A | 11/1997 | Satoh et al. |
| 5,688,042 A | 11/1997 | Madadi et al. |
| 5,697,695 A | 12/1997 | Lin et al. |
| 5,726,535 A | 3/1998 | Yan |
| 5,731,759 A | 3/1998 | Finucan |
| 5,803,579 A | 9/1998 | Turnbull et al. |
| 5,803,580 A | 9/1998 | Tseng |
| 5,803,729 A | 9/1998 | Tsimerman |
| 5,810,463 A | 9/1998 | Kawahara et al. |
| 5,813,751 A | 9/1998 | Shaffer |
| 5,813,753 A | 9/1998 | Vriens et al. |
| 5,825,051 A | 10/1998 | Bauer et al. |
| 5,850,126 A | 12/1998 | Kanbar |
| 5,865,529 A | 2/1999 | Yan |
| 5,890,794 A | 4/1999 | Abtahi et al. |
| 5,917,287 A * | 6/1999 | Haederle et al. ............. 315/136 |
| 5,921,660 A | 7/1999 | Yu |
| 5,924,784 A * | 7/1999 | Chliwnyj et al. ............. 362/234 |
| 5,936,599 A * | 8/1999 | Reymond ....................... 345/82 |
| 5,943,802 A | 8/1999 | Tijanic |
| 5,949,347 A | 9/1999 | Wu |
| 5,998,928 A | 12/1999 | Hipp |
| 6,007,209 A | 12/1999 | Pelka |
| 6,028,694 A | 2/2000 | Schmidt |
| 6,030,099 A | 2/2000 | McDermott |
| 6,056,420 A | 5/2000 | Wilson et al. |
| 6,068,383 A | 5/2000 | Robertson et al. |
| 6,072,280 A | 6/2000 | Allen |
| 6,135,620 A | 10/2000 | Marsh |
| 6,149,283 A | 11/2000 | Conway et al. |
| 6,158,882 A | 12/2000 | Bischoff, Jr. |
| 6,217,190 B1 | 4/2001 | Altman et al. |
| 6,227,679 B1 | 5/2001 | Zhang et al. |
| 6,238,075 B1 | 5/2001 | Dealey, Jr. et al. |
| 6,252,350 B1 | 6/2001 | Alvarez |
| 6,268,600 B1 | 7/2001 | Nakamura et al. |
| 6,275,397 B1 | 8/2001 | McClain |
| 6,283,612 B1 | 9/2001 | Hunter |
| 6,305,109 B1 | 10/2001 | Lee |
| 6,305,821 B1 | 10/2001 | Hsieh et al. |
| 6,325,651 B1 | 12/2001 | Nishihara et al. |
| 6,354,714 B1 | 3/2002 | Rhodes |
| 6,361,186 B1 | 3/2002 | Slayden |
| 6,362,578 B1 | 3/2002 | Swanson et al. |
| 6,371,637 B1 | 4/2002 | Atchinson et al. |
| 6,388,393 B1 * | 5/2002 | Illingworth ................... 315/291 |
| 6,394,623 B1 | 5/2002 | Tsui |
| 6,394,643 B1 | 5/2002 | Bublewitz et al. |
| 6,404,131 B1 | 6/2002 | Kawano et al. |
| 6,411,045 B1 * | 6/2002 | Nerone ......................... 315/291 |
| 6,471,388 B1 | 10/2002 | Marsh |
| 6,528,954 B1 | 3/2003 | Lys et al. |
| 6,538,375 B1 | 3/2003 | Duggal et al. |
| 6,541,800 B2 | 4/2003 | Barnett et al. |
| 6,568,834 B1 | 5/2003 | Scianna |
| 6,577,072 B2 | 6/2003 | Saito et al. |
| 6,577,794 B1 | 6/2003 | Currie et al. |
| 6,582,103 B1 | 6/2003 | Popovich et al. |
| 6,583,550 B2 | 6/2003 | Iwasa et al. |
| 6,592,238 B2 | 7/2003 | Cleaver et al. |
| 6,609,804 B2 | 8/2003 | Nolan et al. |
| 6,621,222 B1 | 9/2003 | Hong |
| 6,623,151 B2 | 9/2003 | Pederson |
| 6,639,349 B1 | 10/2003 | Bahadur |
| 6,641,284 B2 | 11/2003 | Stopa et al. |
| 6,676,284 B1 | 1/2004 | Wynne Willson |
| 6,682,205 B2 | 1/2004 | Lin |
| 6,712,486 B1 | 3/2004 | Popovich et al. |
| 6,762,562 B2 | 7/2004 | Leong |
| 6,846,094 B2 | 1/2005 | Luk |
| 6,853,151 B2 | 2/2005 | Leong et al. |
| 6,857,924 B2 | 2/2005 | Fu et al. |
| 6,860,628 B2 | 3/2005 | Robertson et al. |
| 6,871,981 B2 | 3/2005 | Alexanderson et al. |
| 6,874,924 B1 | 4/2005 | Hulse et al. |
| 6,882,111 B2 | 4/2005 | Kan et al. |
| 6,936,968 B2 | 8/2005 | Cross et al. |
| 6,965,197 B2 | 11/2005 | Tyan et al. |
| 6,995,681 B2 | 2/2006 | Pederson |
| 6,997,576 B1 | 2/2006 | Lodhie et al. |
| 7,014,336 B1 | 3/2006 | Ducharme et al. |
| 7,033,036 B2 | 4/2006 | Pederson |
| 7,049,761 B2 | 5/2006 | Timmermans et al. |
| 7,064,674 B2 | 6/2006 | Pederson |
| 7,128,442 B2 | 10/2006 | Lee et al. |
| 7,132,785 B2 | 11/2006 | Ducharme |
| 7,161,313 B2 | 1/2007 | Piepgras et al. |
| 7,249,865 B2 | 7/2007 | Robertson |
| 7,306,353 B2 | 12/2007 | Popovich et al. |
| 7,352,339 B2 | 4/2008 | Morgan et al. |
| 7,427,840 B2 | 9/2008 | Morgan et al. |
| 7,510,299 B2 | 3/2009 | Timmermans et al. |
| 8,093,823 B1 | 1/2012 | Ivey et al. |
| 8,247,985 B2 | 8/2012 | Timmermans et al. |
| 8,382,327 B2 | 2/2013 | Timmermans et al. |
| 2002/0048174 A1 | 4/2002 | Pederson |
| 2003/0076281 A1 | 4/2003 | Morgan et al. |
| 2003/0102810 A1 | 6/2003 | Cross et al. |
| 2004/0012959 A1 | 1/2004 | Robertson et al. |
| 2004/0062041 A1 | 4/2004 | Cross et al. |
| 2004/0085219 A1 | 5/2004 | Pederson |
| 2004/0145490 A1 | 7/2004 | Pederson |
| 2004/0212993 A1 | 10/2004 | Morgan et al. |
| 2005/0041424 A1 | 2/2005 | Ducharme |
| 2005/0093488 A1 | 5/2005 | Hung et al. |
| 2005/0099317 A1 | 5/2005 | Pederson |
| 2005/0110384 A1 | 5/2005 | Peterson |
| 2005/0184667 A1 | 8/2005 | Sturman et al. |
| 2005/0259424 A1 | 11/2005 | Zampini et al. |
| 2006/0126325 A1 | 6/2006 | Lefebvre et al. |
| 2007/0030683 A1 | 2/2007 | Popovich et al. |
| 2007/0228999 A1 * | 10/2007 | Kit ................. 315/291 |
| 2008/0012502 A1 * | 1/2008 | Lys ................. 315/247 |

FOREIGN PATENT DOCUMENTS

| | | |
|---|---|---|
| DE | 298 17 609 U1 | 1/2000 |
| DE | 200 18 865 U1 | 2/2001 |
| EP | 0 632 511 A2 | 1/1995 |
| EP | 0632511 A2 | 1/1995 |
| JP | H6-054103 | 7/1994 |
| JP | H8-162677 | 6/1996 |
| JP | H11-135274 | 5/1999 |
| JP | H11-162234 A | 6/1999 |
| JP | H11-260125 A | 9/1999 |
| WO | 9945312 A1 | 9/1999 |
| WO | 9957945 A1 | 9/2009 |

OTHER PUBLICATIONS

*Altair Engineering, Inc.* v. *Leddynamics, Inc.*, Case No. 07-CV-13150 (E.D. Mich., Aug. 12, 2008) (J. Steeh) ("Order Resolving Claim Construction Dispute" for U.S. Pat. No. 7,049,761).
Web Page at http://trucklite.com/leds 14.html printed on Jan. 13, 2000.
Web Page at http://trucklite.com/leds 2.html printed on Jan. 13, 2000.
Web Page at http://trucklite.com/leds 4.html printed on Jan. 13, 2000.
Web Page at http://www.telecite.com/en/products/options en.htm printed on Jan. 13, 2000.
Web Page at http://www.dialite.com/trans.html printed on Jan. 13, 2000.
Web Page at http://www.ledlights.com/replac.html printed on Jan. 13, 2000.
Defendant's Invalidity Contentions in *Altair Engineering, Inc.* v. *Leds America, Inc.*, Civil Case No. 2:10-CV-13424 (E. D. Mich) (J. O'Meara) (Feb. 4, 2011).
Decision in *Altair Engineering, Inc.* v. *LEDdynamics* (Fed. Cir. Mar. 9, 2011).
Decision in *Robertson* v. *Timmermans* (Fed. Cir. May 5, 2010).
Ledtronics, two pages (apparently cover page and page 10) of Catalog (1996).

* cited by examiner

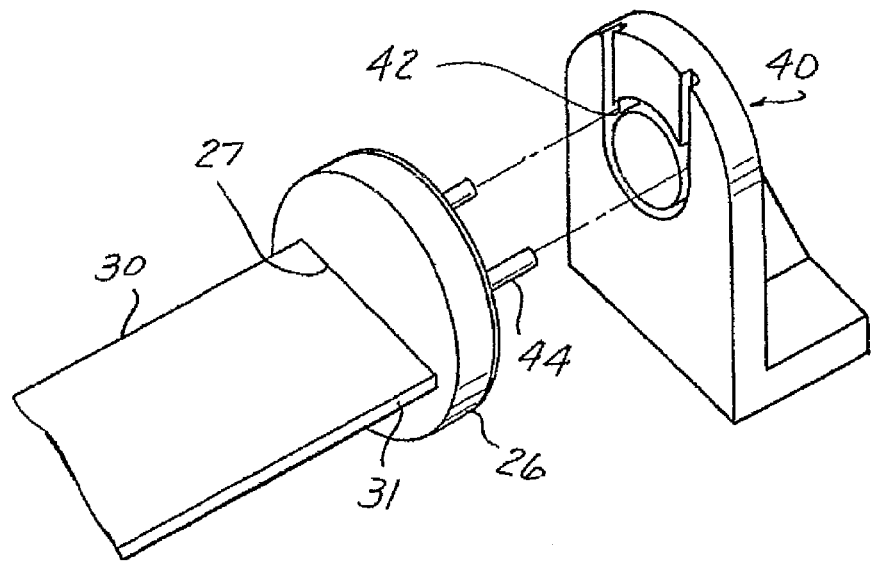
FIG. 11
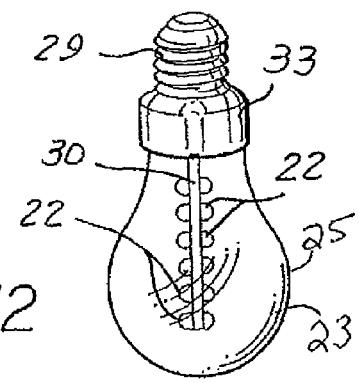
FIG. 12
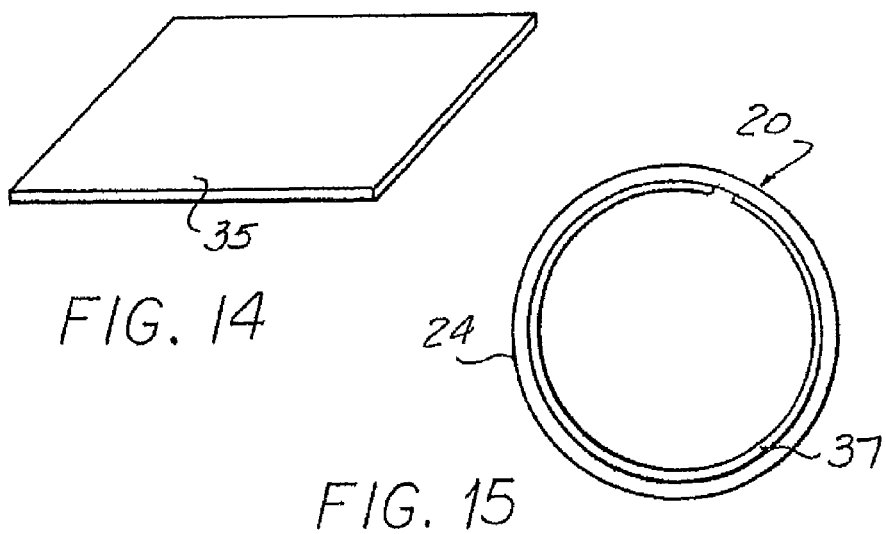
FIG. 14
FIG. 15

LIGHT SOURCES INCORPORATING LIGHT EMITTING DIODES

CROSS-REFERENCE TO RELATED APPLICATIONS

This application is a continuation of Ser. No. 11/007,417, filed Dec. 8, 2004 now U.S. Pat. No. 8,093,823, which is a continuation-in-part of U.S. patent application Ser. No. 09/782,375, filed Feb. 12, 2001, now U.S. Pat. No. 7,049,761, issued May 23, 2006, which claims priority to provisional Application Ser. No. 60/181,744, filed Feb. 11, 2000.

BACKGROUND OF THE INVENTION

1. Field of the Invention

The present invention relates to light sources incorporating light emitting diodes.

2. Description of the Related Art

All lighting systems have shortcomings. Conventional fluorescent lighting systems include, for example, light sources such as fluorescent light tubes and ballasts. Fluorescent lighting systems are used in a variety of locations, such as buildings and transit buses, for a variety of lighting purposes, such as area lighting or backlighting. Such systems have some advantage over incandescent lighting systems, which include light sources such as light bulbs incorporating filaments. Fluorescent lighting systems, for example, generate less heat. On the other hand, the light generated by fluorescent lighting systems is less desirable in many applications than incandescent lighting systems because conventional fluorescent lighting systems generally produce a cooler light that has more blue and less red than incandescent lighting systems. Conventional fluorescent and incandescent lighting systems can also include fragile components. Fluorescent light tubes, in particular, have a short life expectancy, are prone to fail when subjected to excessive vibration, consume high amounts of power, require a high operating voltage and include several electrical connections that reduce reliability. Conventional ballasts are highly prone to fail when subjected to excessive vibration.

SUMMARY OF THE INVENTION

The present invention includes replacements for conventional light sources such as fluorescent light tubes and incandescent light bulbs that overcomes the disadvantages of the prior art. Specifically, the invention comprises various light sources incorporating light emitting diodes. Light emitting diodes can be manufactured that have superior color rendering than most fluorescent lamps, which improves the usability and aesthetic qualities of the light. In addition, light emitting diodes are less fragile than incandescent and fluorescent lighting components.

A first embodiment of the light source according to the present invention comprises a housing portion, a connector disposed at an end of the housing portion, at least one organic light emitting diode sheet surrounded by at least a portion of the housing portion, the at least one organic light emitting diode sheet in electrical communication with the connector, and a power supply circuit for supplying electrical current to the at least one organic light emitting diode sheet through the connector. The housing portion can comprise a rigid hollow bulb made of glass or plastic, for example, or can comprise a clear or tinted potting material or a thin conformal coating. The organic light emitting diode sheet(s) can be flexible. Other variations of this embodiment are possible and are described in more detail herein.

A second embodiment of the light source according to the present invention comprises a housing portion formed of a coating material, a connector disposed at an end of the housing portion, a plurality of light emitting diodes surrounded by the housing portion and mounted on a circuit board, the plurality of light emitting diodes electrically coupled to the connector, and a power supply circuit for supplying electrical current to the plurality of light emitting diodes, the power supply circuit electrically coupled to the connector. The coating material can be a clear or tinted potting material or can be a thin conformal coating for the circuit board and light emitting diodes. At least part of the power supply circuit can be mounted on the circuit board. Other variations of this embodiment are also possible and are described in more detail herein.

A second embodiment of the light source according to the present invention comprises a connector adapted to be coupled to an electrical socket, a circuit board extending from the connector, at least one light emitting diode mounted on the circuit board and in electrical communication with the connector, the at least one light emitting diode exposed to an ambient environment external of the light source, and a power supply circuit for supplying electrical current to the at least one light emitting diode through the connector.

Other embodiments are described in more detail herein.

BRIEF DESCRIPTION OF THE DRAWINGS

The description herein makes reference to the accompanying drawings wherein like reference numerals refer to like parts throughout the several views, and wherein:

FIG. 11 is a fragmentary, perspective view similar to FIG. 4 showing another embodiment of the circuit board;

FIG. 12 is a line drawing showing a light bulb, in perspective view, which in accordance with the present invention is illuminated by LEDs packaged inside the light bulb;

FIG. 13 is a cross-sectional view of FIG. 1 taken along lines 13-13;

FIG. 14 is a perspective view of a sheet comprising an organic light-emitting diode that can be incorporated into the light sources of the present invention; and FIG. 15 is an end view of a light tube omitting the end cap and electronics and incorporating an organic light-emitting diode.

DETAILED DESCRIPTION

Figure 1:
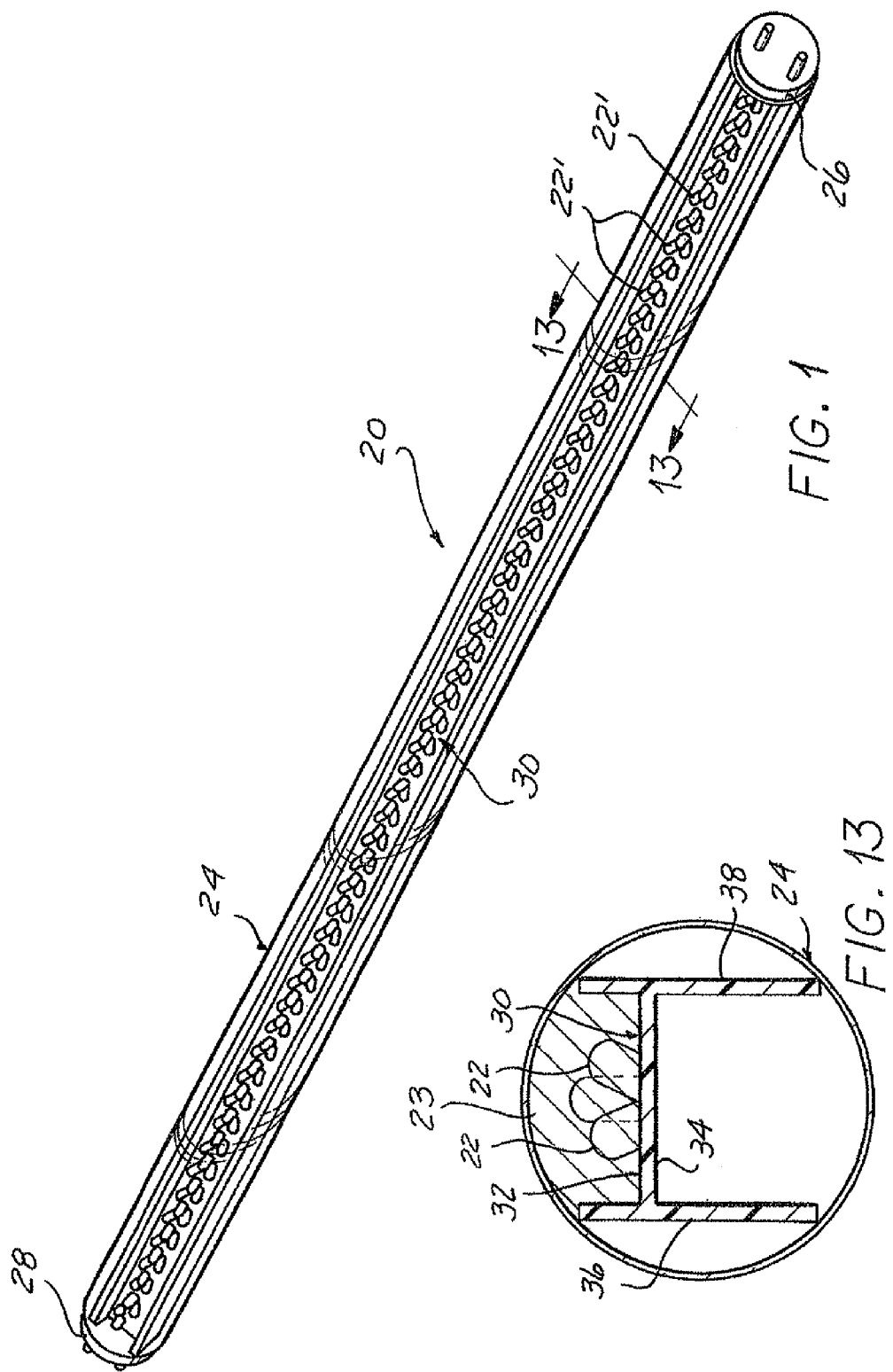
FIG. 1 is a line drawing showing a light tube, in perspective view, which in accordance with the present invention is illuminated by LEDs packaged inside the light tube.

FIG. 1 is a perspective view showing a light source according to the invention in the form of a light tube 20. In accordance with a first embodiment of the invention, the light tube 20 is illuminated by LEDs 22 packaged inside the light tube 20. The light tube 20 includes a cylindrically shaped housing portion 24 having a pair of end caps 26 and 28 disposed at opposite ends of the housing portion 24. Preferably, the housing portion 24 is made from a transparent or translucent material such as glass, plastic, or the like. As such, the housing material may be either clear or frosted.

Figure 4:
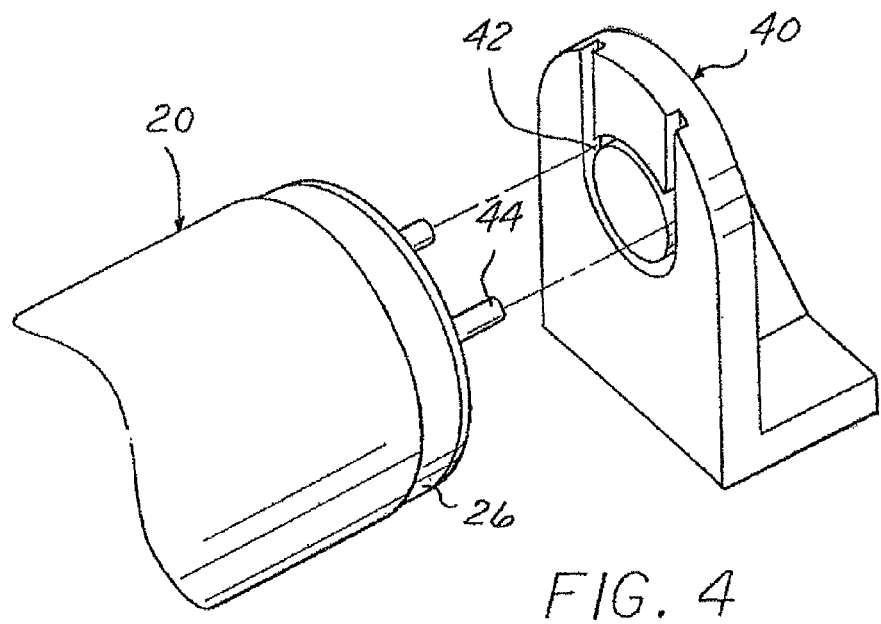
FIG. 4 is a fragmentary, perspective view of one embodiment of the present invention showing one end of the light tube disconnected from one end of a light tube socket.

In a preferred embodiment of the present invention, the light tube 20 has the same dimensions and end caps 26 and 28 (e.g., electrical male bi-pin connectors, type G13) as a conventional fluorescent light tube. As such, the present invention can be mounted in a conventional fluorescent light tube socket 40 as shown in FIG. 4. FIG. 4 is a fragmentary, perspective view of one embodiment of the present invention showing one end of the light tube 20 disconnected from one end of a light tube socket 40. Similar to conventional fluorescent lighting systems and in this embodiment of the present invention, the light tube socket 40 includes a pair of electrical female connectors 42 and the light tube 20 includes a pair of mating electrical male connectors 44.

Figure 9:
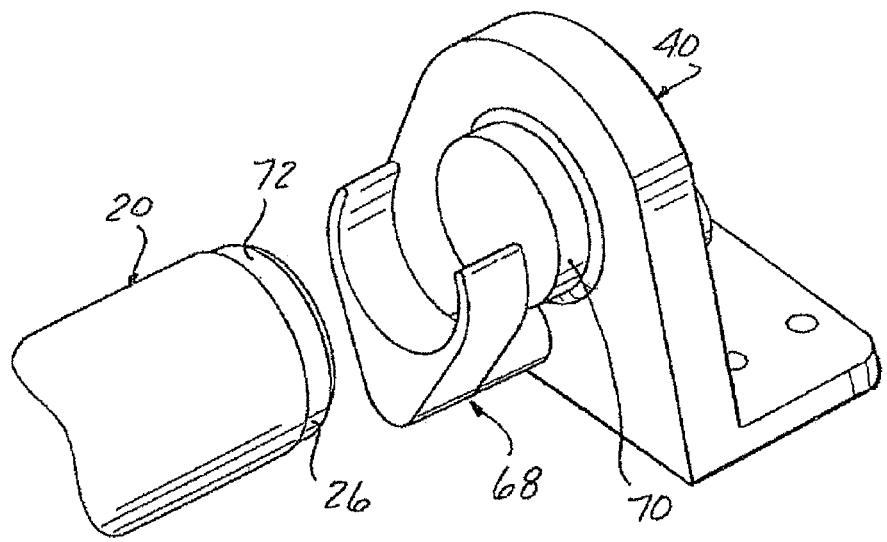
FIG. 9 is a fragmentary, perspective view of a second embodiment of the present invention showing one end of a light tube disconnected from one end of the light tube socket.

Alternatively, end caps with single-pin connectors, incorporating so-called "instant start" ballasts, as well as recessed double-pin connectors are also possible with suitable mounting sockets for this embodiment. Another possible connector and its related socket for a light tube 20 are shown in FIG. 9. FIG. 12, discussed in more detail below, shows yet another connector in a different embodiment of the light source according to the present invention. The light tube 20 could also be in the form of a conventional round housing portion, i.e., the "doughnut" shaped bulb, with the 4-pin connector used with such bulbs.

Returning now to FIG. 1, the line drawing of FIG. 1 also reveals the internal components of the light tube 20. The light tube 20 further includes a circuit board 30 with the LEDs 22 mounted thereon. The circuit board 30 and LEDs 22 are enclosed inside the housing portion 24 and the end caps 26 and 28.

Figure 2:
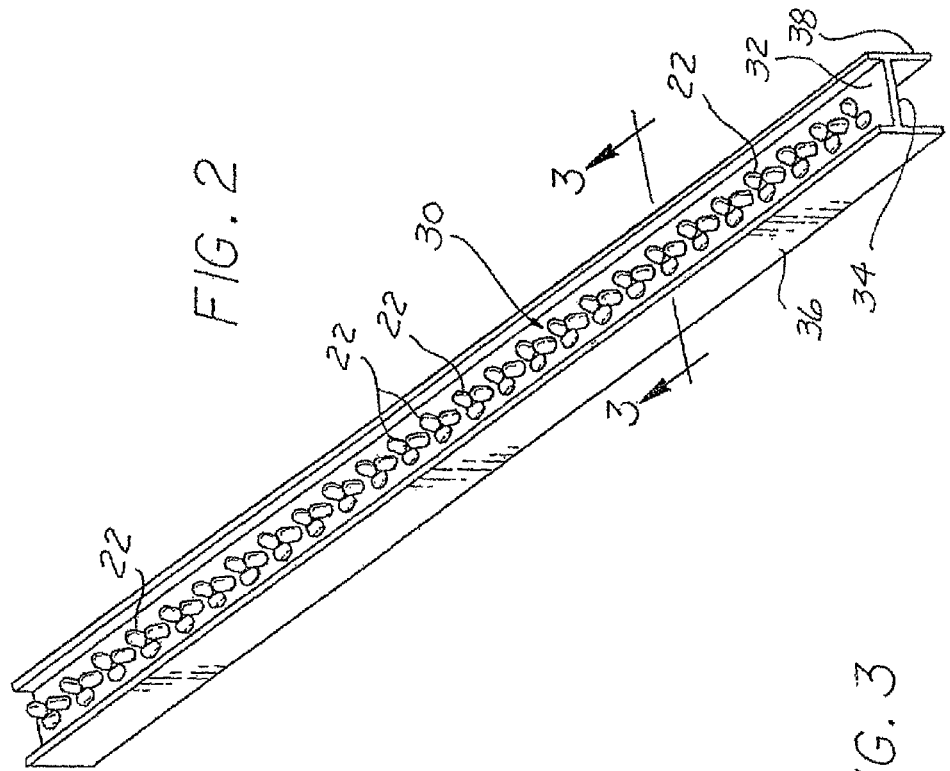
FIG. 2 is a perspective view of the LEDs mounted on a circuit board.

FIG. 2 is a perspective view of the LEDs 22 mounted on the circuit board 30. A group of LEDs 22, as shown in FIG. 2, is commonly referred to as a bank or array of LEDs. Within the scope of the present invention, the light tube 20 may include one or more banks or arrays of LEDs 22 mounted on one or more circuit boards 30. In a preferred embodiment of the present invention, the LEDs 22 emit white light and, thus, are commonly referred to in the art as white LEDs. In FIGS. 1 and 2, the LEDs 22 are mounted to one surface 32 of the circuit board 30. In a preferred embodiment of the present invention, the LEDs 22 are arranged to emit or shine white light through only one side of the housing portion 24, thus directing the white light to a predetermined point of use. This arrangement reduces light losses due to imperfect reflection in a conventional lighting fixture. In alternative embodiments of the present invention, LEDs 22 may also be mounted, in any combination, to the other surfaces 34, 36 and/or 38 of the circuit board 30.

Figure 3:
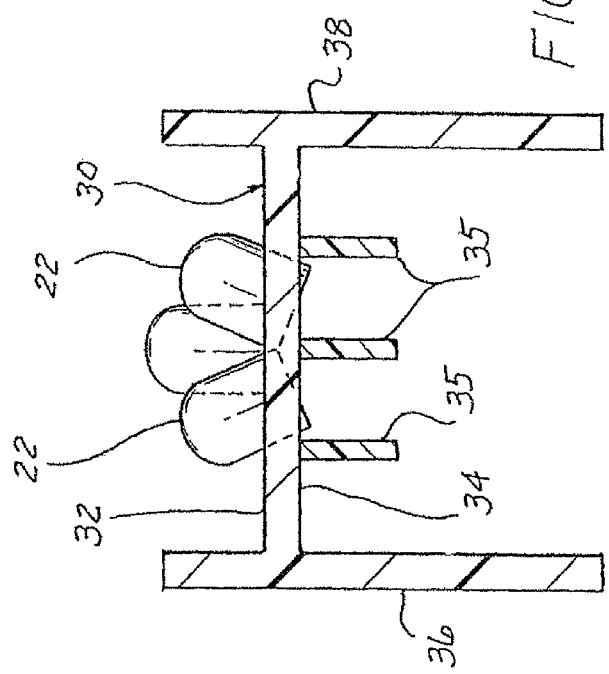
FIG. 3 is a cross-sectional view of FIG. 2 taken along lines 3-3 with the addition of optional heat sinks.

FIG. 3 is a cross-sectional view of FIG. 2 taken along lines 3-3. To provide structural strength along the length of the light tube 20, the circuit board 30 shown is designed with an H-shaped cross-section that fits snugly into the light tube 20. To produce a predetermined radiation pattern or dispersion of light from the light tube 20, each LED 22 is mounted at an angle relative to adjacent LEDs and/or the mounting surface 32. The total radiation pattern of light from the light tube 20 is affected by (1) the mounting angle of the LEDs 22 and (2) the radiation pattern of light from each LED. Currently, white LEDs having a viewing range between 6° and 120° are commercially available. Note that FIG. 3 includes optional heat sinks 35, not included in FIG. 2, which extend from the side 34 of the circuit board 30 opposed to the LEDs 22. The addition of the heat sinks 35 may be desirable in certain environments and where a large number of LEDs 22 are incorporated. The heat sinks 35 could be made of metal, ceramic or other heat dissipating materials and, of course, could be incorporated in different numbers or configurations.

Although the circuit board 30 as shown is H-shaped as discussed above, other shapes for the circuit board 30 are possible. For example, the circuit board 30 may be a conventional flat circuit board 30 as shown in FIG. 11. Note that the housing portion 24 has been omitted, and the plurality of LEDs 22 has been removed from FIG. 11 for additional clarity. In such a configuration, the end 31 of the circuit board 30 could be fixed within a recess 27 of the end cap 26 or otherwise fixed, such as by glue, to the end cap 26. In yet another embodiment, the circuit board 30 could be a flexible circuit board in the form of a thin piece of Mylar or similar material, either laid on a mounting surface or arranged in a housing portion.

Additional support for the light emitting diodes and the circuit board may be provided in the embodiment of FIG. 11 or any other embodiment by coating the board, such as, for example, potting the board 30 by filling in the empty space around the board 30 or part of the board 30 with any known transparent, translucent or tinted material such as is shown in FIG. 12. A conformal coating comprising a resin or other known materials could be used. By example, FIG. 12 shows a light source according to the invention in the form of a light bulb. The light bulb includes a housing portion 25 in the form of a conventional incandescent light bulb portion with a conventional Edison screw connector 29 and a ballast 33. The connector 29 would screw into a conventional base. The ballast 33 can be, for example, the ballast of a conventional self-ballasted compact fluorescent light bulb, or it could be merely an enclosure to incorporate control electronics as discussed in more detail herein. The ballast 33 could also be omitted with certain designs of the control electronics where the electronics would be incorporated into the housing portion 25, the connector 29 or the base (not shown). A circuit board 30 coupled to the ballast 33 extends from the ballast 33 into the housing portion 25. A plurality of LEDs 22 is mounted on opposing sides of the circuit board 30. The space between the circuit board 30 and the LEDs 22 and the housing portion 25 is filled with slightly tinted material 23. In some cases, as where the material 23 is tinted, the potting material 23 can provide the benefit of making the light from the discrete LEDs 22 more diffuse.

The use of the potting material 23 with the embodiment according to FIG. 1 is shown in the cross-sectional view of FIG. 13. It is worth noting that, as can be seen by reference to FIGS. 11-13, the glass, plastic or the like that normally forms a housing portion 24, 25 can be omitted. In controlled environments, the circuit board 30 and LEDs 22 can be left unprotected. An alternative is to form the housing portion using a coating material such as the potting material 23 or a conformal coating molded over the LEDs 22 and circuit board 30. Particularly advantageous can be the use of potting material 23 as shown in FIGS. 12 and 13 where the potting material 23 forms a shape at least partially in the form of a conventional bulb. FIG. 12 shows the potting material 23 shaped in as a conventional incandescent bulb and surrounded by a glass, plastic, etc. housing portion 25. If that housing portion 25 is omitted, the potting material 23 would form a housing portion for the light source. FIG. 13 shows the potting material 23 forming a shape that partially conforms to a conventional tube that would, if the part identified as the housing portion 24 were omitted, form the housing portion. With respect to FIG. 13, the potting material 23 could alternatively be molded around the entire circuit board 30 to complete the shape of the conventional tube and serve as the housing portion, which would simplify the couplings to the connectors 26, 28. As another option, the shape of the potting compound can act as a lens to affect the light distribution from the light source. This property can be used to optimize the light distribution for a particular application.

Within the scope of the present invention, light sources such as the light tube 20 may be powered by current supplied by one of at least four power supply circuits 100, 200, 300, and 400. A first power supply circuit includes a power source and any conventional fluorescent ballast used to power a conventional fluorescent tube. This may include iron ballasts, high-frequency switchmode ballasts or other ballast technologies. A second power supply circuit includes a power source and a rectifier/filter circuit and eliminates the ballast. A third power supply circuit includes a DC power source and a PWM (Pulse Width Modulation) circuit. A fourth power supply circuit powers the light sources inductively.

In the embodiments presented, the power conditioning circuits are shown as a rectifier/filter circuit coupled to a PWM switch circuit, which is coupled to a current-limiting circuit. They constitute a particular topology for a switching power supply as an example, and the invention is not intended to be limited thereby. One skilled in the art, provided with the teachings and goals herein, would know how to modify the topology from that described herein.

Figure 5:
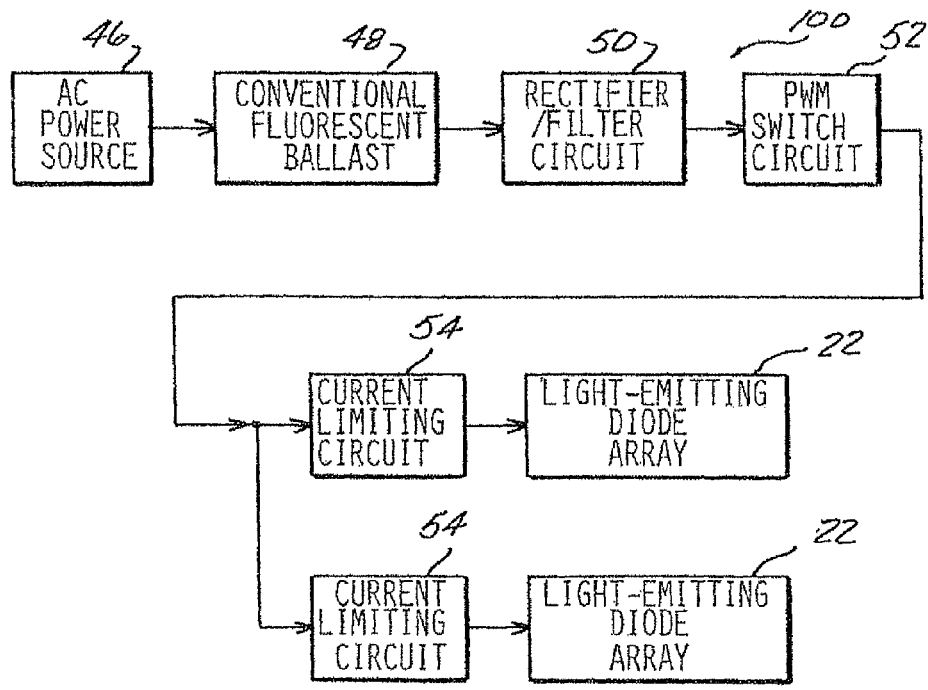
FIG. 5 is an electrical block diagram of a first power supply circuit for supplying current to power a light source incorporating LEDs.

FIG. 5 is an electrical block diagram of a first power supply circuit 100 for supplying current to the light sources. The first power supply circuit 100 is particularly adapted to operate within an existing, conventional fluorescent lighting system that incorporates a ballast. Using the light tube 20 as an example, the first power supply circuit 100 includes a conventional fluorescent light tube socket 40 having two electrical female connectors 42 disposed at opposite ends of the socket. Accordingly, a light tube 20 particularly adapted for use with the first power supply circuit 100 includes two end caps 26 and 28, each end cap having the form of an electrical male connector 44 which mates with a corresponding electrical female connector 42 in the socket 40.

The first power supply circuit 100 also includes a power source 46 and a conventional magnetic or electronic fluorescent ballast 48. The power source 46 supplies power from the conventional fluorescent ballast 48 through the connectors for the light source such as the connectors 40, 42.

The first power supply circuit 100 further includes a rectifier/filter circuit 50, a PWM circuit 52, and one or more current-limiting circuits 54. In this example, the rectifier/filter circuit 50, the PWM circuit 52, and the one or more current-limiting circuits 54 of the first power supply circuit 100 are packaged inside one of the two end caps 26 or 28 of the light tube 20. The electronics described could be mounted with the ballast 33, 48, or could alternatively be mounted on the circuit board 30.

The rectifier/filter circuit 50 receives AC power from the ballast 48 and converts the AC power to DC power. The PWM circuit 52 receives the DC power from the rectifier/filter circuit 50 and pulse-width modulates the DC power to the one or more current-limiting circuits 54. In a preferred embodiment of the present invention, the PWM circuit 52 receives the DC power from the rectifier/filter circuit 50 and cyclically switches the DC power on and off to the one or more current-limiting circuits 54. The DC power is switched on and off by the PWM circuit 52 at a frequency which causes the white light emitted from the LEDs 22 to appear, when viewed with a "naked" human eye, to shine continuously. The PWM duty cycle can be adjusted or varied by control circuitry (not shown) to maintain the power consumption of the LEDs 22 at safe levels.

The DC power is modulated for several reasons. First, the DC power is modulated to adjust the brightness or intensity of the white light emitted from the LEDs 22 and, in turn, adjust the brightness or intensity of the white light emitted from the light source, here light tube 20. Optionally, the brightness or intensity of the white light emitted from the light source may be adjusted by a user. Second, the DC power is modulated to regulate the intensity of light emitted from the light source to compensate for supply voltage fluctuations, ambient temperature changes, and other such factors that affect the intensity of white light emitted by the LEDs 22. Third, the DC power is modulated to raise the variations of the frequency of light above the nominal variation of 120 to 100 Hz thereby reducing illumination artifacts caused by low frequency light variations, including interactions with video screens. Fourth, the DC power may optionally be modulated to provide an alarm function wherein light from the light source cyclically flashes on and off.

The one or more current-limiting circuits 54 receive the pulse-width modulated or switched DC power from the PWM circuit 52 and transmit a regulated amount of power to one or more arrays of LEDs 22. Each current-limiting circuit 54 powers a bank of one or more white LEDs 22. If a bank of LEDs 22 consists of more than one LED, the LEDs are electrically connected in series in an anode to cathode arrangement. If brightness or intensity variation between the LEDs 22 can be tolerated, the LEDs can be electrically connected in parallel.

The one or more current-limiting circuits 54 may include (1) a resistor, (2) a current-limiting semiconductor circuit, or (3) a switching power supply-type current limiter. Note that while it is desirable to include such circuits 54, in some circumstances the necessary current-limiting function may be performed by the inherent electrical characteristics of the fluorescent ballast 48 and/or the inherent electrical resistance of the LEDs 22.

Figure 6:
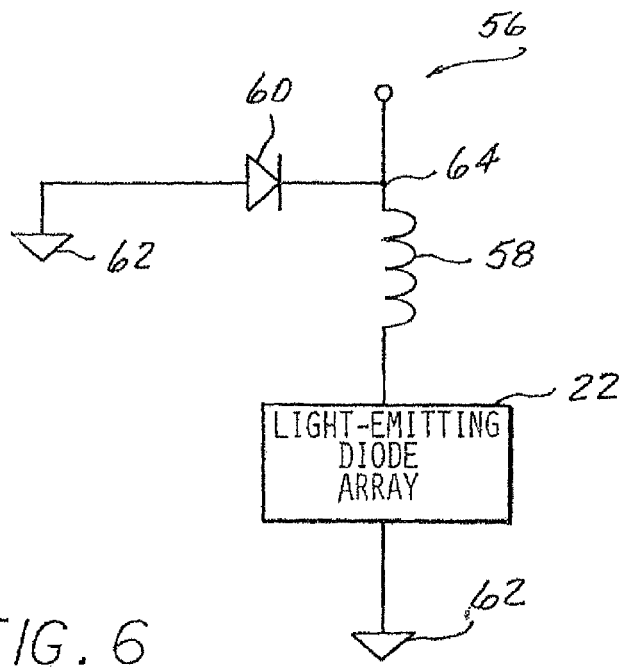
FIG. 6 is an electrical schematic of a switching power supply type current limiter.

FIG. 6 is an electrical schematic of a switching power supply-type current limiter 56. The limiter 56 includes an inductor 58, electrically connected in series between the PWM circuit 52 and the array of LEDs 22, and a power diode 60, electrically connected between ground 62 and a PWM circuit/inductor node 64. The diode 60 is designed to begin conduction after the PWM circuit 52 is switched off. In this case, the value of the inductor 58 is adjusted in conjunction with the PWM duty cycle to provide the benefits described above. The switching power supply-type current limiter 56 provides higher power efficiency than the other types of current-limiting circuits listed above.

Figure 7:
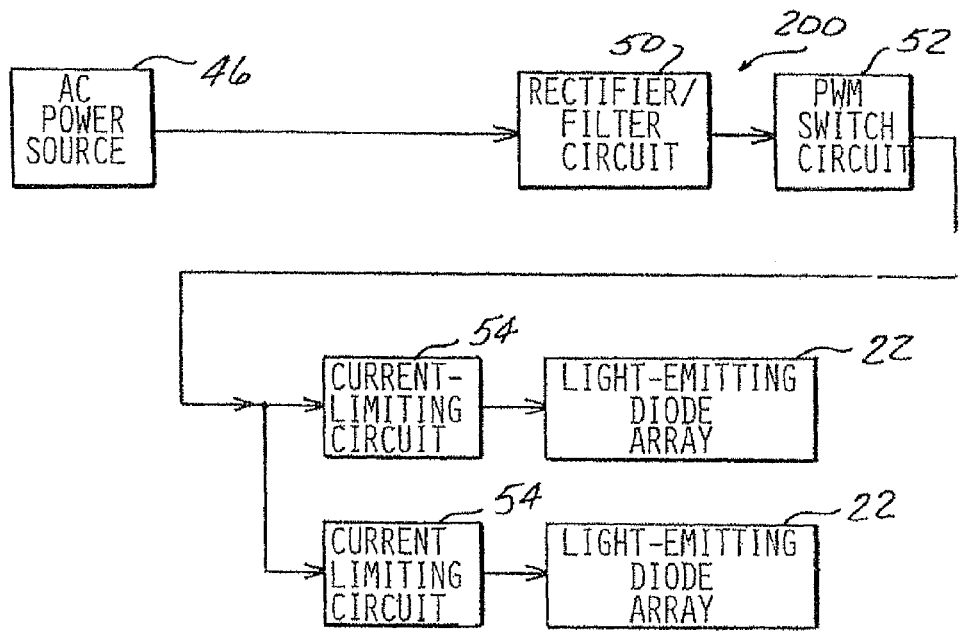
FIG. 7 is an electrical block diagram of a second power supply circuit for supplying current to power a light source incorporating LEDs.

FIG. 7 is an electrical block diagram of a second power supply circuit 200 for supplying current to a light source according to the present invention. By example, the second power supply circuit 200 includes a conventional fluorescent light tube socket 40 having two electrical female connectors 42 disposed at opposite ends of the socket 40. Accordingly, a light tube 20 particularly adapted for use with the second power supply circuit 200 would include two end caps 26 and 28, each end cap having the form of an electrical male connector 44, which mates with a corresponding electrical female connector 42 in the socket 40.

In the second power supply circuit 200, the power source 46 supplies power directly to the rectifier/filter circuit 50 through connectors, end caps 26, 28 or base 29. The rectifier/filter circuit 50, the PWM circuit 52, and the one or more current-limiting circuits 54 operate as described above to power the one or more arrays of LEDs 22. The rectifier/filter circuit 50, the PWM circuit 52, and the one or more current-limiting circuits 54 of the second power supply circuit 200 are preferably packaged inside the connectors, end caps 26, 28 or base 29, or the housing portion 24, 25 of the light source or inside the light socket(s) corresponding to the one or more connectors. This configuration has the benefit of eliminating the conventional ballast 48 from the circuit, allowing direct powering of the light source from a standard building or vehicle power supply. This allows improved efficiency and reduced maintenance cost over the conventional fluorescent system.

Figure 8:
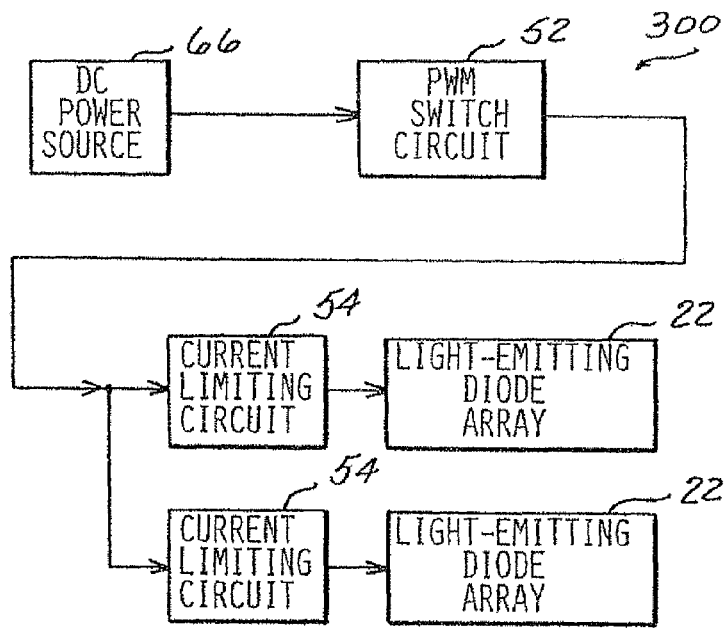
FIG. 8 is an electrical block diagram of a third power supply circuit for supplying current to power a light source incorporating LEDs.

FIG. 8 is an electrical block diagram of a third power supply circuit 300 for supplying current to a light source according to the present invention. Similar to the first and second power supply circuits 100 and 200, the third power supply circuit 300 can include a conventional fluorescent light tube socket 40 having two electrical female connectors 42 disposed at opposite ends of the socket 40. Accordingly, a light tube 20 particularly adapted for use with the third power supply circuit 300 would include two end caps 26 and 28, each end cap having the form of an electrical male connector 44, which mates with a corresponding electrical female connector 42 in the socket 40.

The third power supply circuit 300 includes a DC power source 66, such as a vehicle battery. In the third power supply circuit 300, the DC power source 66 supplies DC power directly to the PWM circuit 52. The PWM circuit 52 and the one or more current-limiting circuits 54 operate as described above to power the one or more arrays of LEDs 22. In the third power supply circuit 300, the PWM circuit 52 is preferably packaged in physical location typically occupied by a ballast 33, 48 while the one or more current-limiting circuits 54 and LEDs 22 are preferably packaged inside a connector, either one of the two end caps 26 or 28 or the connector 29, or the housing portion 24, 25.

FIG. 9 is a fragmentary, perspective view of another embodiment of the present invention showing one end of the light tube 20 disconnected from one end of the light tube socket 40. In this embodiment of the present invention, the light tube socket 40 includes a pair of brackets 68 and the light tube 20 includes a pair of end caps 26 and 28 which mate with the brackets 68.

Figure 10:
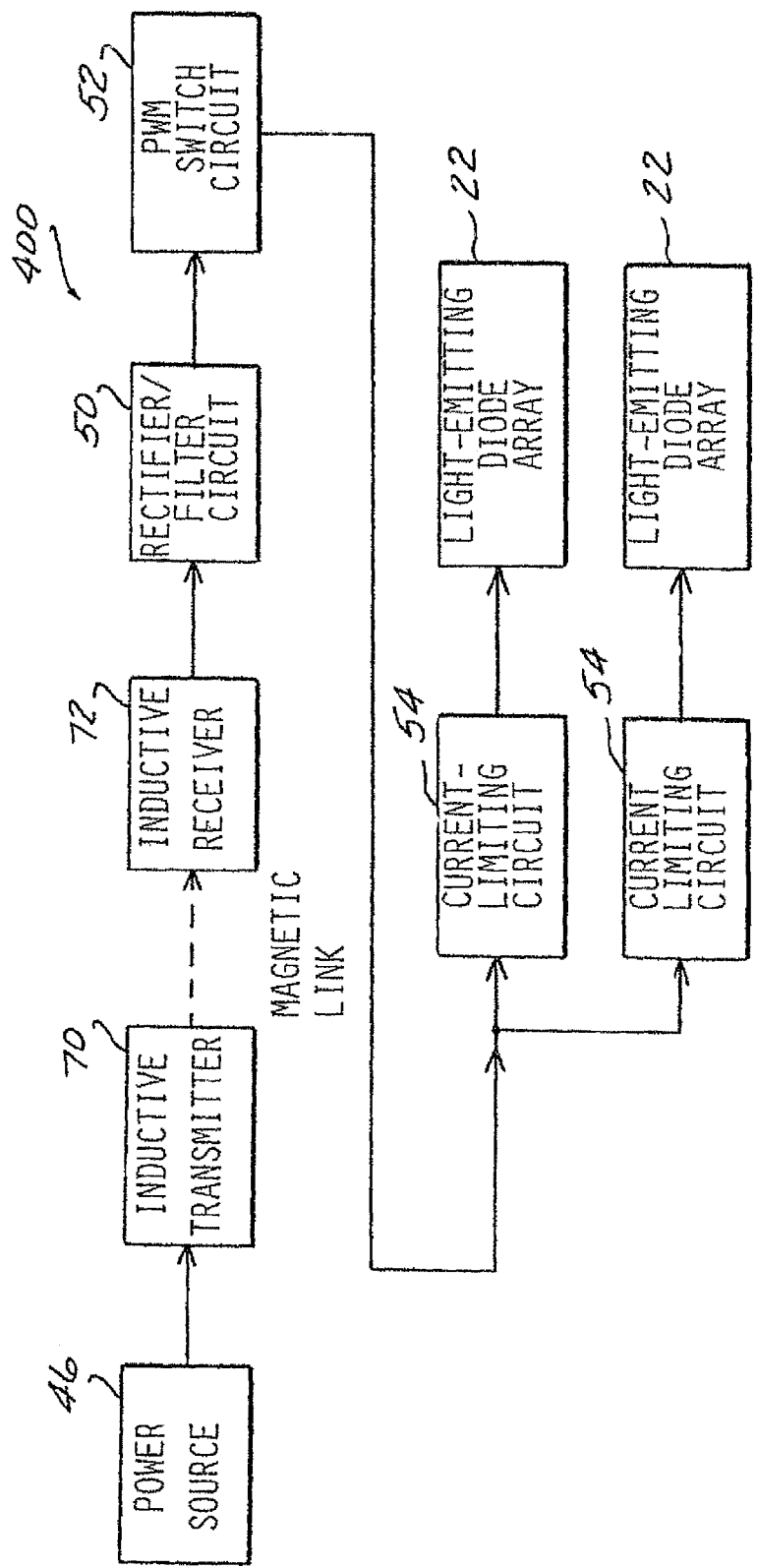
FIG. 10 is an electrical block diagram of a fourth power supply circuit for supplying current to power a light source incorporating LEDs.

FIG. 10 is an electrical block diagram of a fourth power supply circuit 400 for supplying current to the light sources. Unlike the first, second, and third power supply circuits 100, 200, and 300, which are powered through direct electrical male and female connectors 44 and 42, the fourth power supply circuit 400 is powered inductively. As such, the fourth power supply circuit 400 includes a light tube socket 40 having two brackets 68 disposed at opposite ends of the socket 40 as shown in FIG. 9. At least one bracket 68 includes an inductive transmitter 70. Accordingly, a light tube 20 particularly adapted for use with the fourth power supply circuit 400 has two end caps 26 and 28 with at least one end cap including an inductive receiver or antenna 72. When the light tube 20 is mounted in the light tube socket 40, the at least one inductive receiver 72 in the light tube 20 is disposed adjacent to the at least one inductive transmitter 70 in the light tube socket 40.

The fourth power supply circuit 400 includes the power source 46 which supplies power to the at least one inductive transmitter 70 in the light tube socket 40. The at least one transmitter 70 inductively supplies power to the at least one receiver 72 in one of the end caps 26 and/or 28 of the light tube 20. The at least one inductive receiver 72 supplies power to the rectifier/filter circuit 50. The rectifier/filter circuit 50, PWM circuit 52, and the one or more current-limiting circuits 54 operate as described above to power the one or more arrays of LEDs 22. In this manner, the light tube 20 is powered without a direct electrical connection.

The LEDs shown in drawing FIGS. 1-3, 12 and 13 are the common discrete components. However, the invention is not limited to these discrete components. For example, surface-mounted light-emitting diodes that omit the familiar bulb portion are also possible. Another option is the organic LED, which is formed of semiconducting organic polymers layers sandwiched between two conductors. In the instant invention, a single organic LED (OLED), which comprises varying numbers of arrays printed on a substrate, can be made in the form of a sheet such as the rigid OLED sheet 35 shown in FIG. 14. The sheet 35 can be installed on or in place on the circuit boards described herein. An organic LED can also be formed on substrates comprising thin metal foils or flexible plastics. In this case, the organic LED is itself flexible and can be installed such that it is surrounded by a housing portion, such as housing portion 24 of light tube 20 by rolling a sheet comprising a flexible organic LED 37 and allowing it to form the shape of the housing portion 24 as shown in FIG. 15. Of course, in embodiments incorporating the organic LED, the housing portion can still be formed in whole or in part by a coating material such as the potting material 23 or the conforming layer.

What is claimed is:

1. A light source comprising:
a housing portion including, at least in part, a rigid substantially tubular structure;
a connector disposed at an end of the housing portion;
at least one light emitting diode mounted on a flexible substrate located in the housing, the at least one light emitting diode electrically coupled to the connector and the flexible substrate having a curved portion; and
a power supply circuit for supplying electrical current to the at least one light emitting diode, the power supply circuit electrically coupled to the connector, wherein the power supply circuit comprises a rectifier for converting AC to DC power, an electrical circuit that modulates the DC power from the rectifier and at least one current limiting circuit including an inductive element connected to an output of the electrical circuit that modulates the DC power and to an input of the at least one light emitting diode.

2. The light source according to claim 1 wherein the at least one light emitting diode mounted on the flexible substrate comprises a flexible organic light emitting diode sheet in contact with at least a portion of the housing portion and surrounded by at least a portion of the housing portion.

3. The light source according to claim 2 wherein the housing portion comprises a potting material and wherein the potting material is one of clear and tinted.

4. The light source according to claim 2 wherein the housing portion comprises a rigid hollow structure including at least one of glass and plastic.

5. The light source according to claim 2 wherein the connector comprises a first bi-pin electrical connector shaped to be coupled with a fluorescent light tube socket and wherein the housing portion is substantially tubular, the light source further comprising:
 a second bi-pin electrical connector disposed at an opposing end of the hollow tube from the first bi-pin electrical connector, the second bi-pin electrical connector shaped to be coupled with a fluorescent light tube socket.

6. The light source according to claim 1 wherein the at least one light emitting diode comprises a plurality of light emitting diodes and the flexible substrate comprises a flexible circuit board.

7. The light source according to claim 6 wherein the connector comprises a first bi-pin electrical connector shaped to be coupled with a fluorescent light tube socket and wherein an outer surface of the housing portion is tubular-shaped, the light source further comprising:
 a second bi-pin electrical connector disposed at an opposing end of the hollow tube from the first bi-pin electrical connector, the second bi-pin electrical connector shaped to be coupled with a fluorescent light tube socket.

8. The light source according to claim 6, further comprising:
 a heat sink extending from the flexible circuit board to dissipate heat.

9. The light source according to claim 1 wherein the at least one light emitting diode comprises a plurality of light emitting diodes and the flexible substrate comprises a flexible circuit board; and wherein the light source further comprises:
 a heat sink extending from the flexible circuit board to dissipate heat.

10. The light source according to claim 9 wherein the heat sink is integral with the flexible circuit board.

11. The light source according to claim 1 wherein the at least one light emitting diode is at least one organic light emitting diode sheet.

12. The light source according to claim 11 wherein the at least one organic light emitting diode sheet mounted on the flexible substrate is a single flexible sheet.

13. The light source according to claim 11 wherein the connector comprises a first bi-pin electrical connector shaped to be coupled with a fluorescent light tube socket, the light source further comprising:
 a second bi-pin electrical connector disposed at an opposing end of the circuit board from the first bi-pin electrical connector, the second bi-pin electrical connector shaped to be coupled with a fluorescent light tube socket.

14. The light source according to claim 11 wherein the at least one light emitting diode is exposed to an ambient environment external of the light source.

15. The light source according to claim 1 wherein the electrical circuit comprises a pulse width modulator.

16. The light source according to claim 1 wherein the at least one light emitting diode is a plurality of serially-arranged light emitting diodes.

17. The light source according to claim 1 wherein the at least one light emitting diode comprises a plurality of LEDs arranged in spaced apart groups of LEDs wherein a spacing between LEDs in each group is less than a spacing between centers of adjacent groups.

\* \* \* \* \*